US009535620B2

(12) United States Patent
Kim et al.

(10) Patent No.: US 9,535,620 B2
(45) Date of Patent: Jan. 3, 2017

(54) FLASH MEMORY SYSTEM AND METHOD CONTROLLING SAME

(71) Applicant: SAMSUNG ELECTRONICS CO., LTD., Suwon-Si, Gyeonggi-Do (KR)

(72) Inventors: Kyung-Jin Kim, Uiwang-Si (KR); Geun-Soo Kim, Suwon-Si (KR); Jun-Jin Kong, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 2 days.

(21) Appl. No.: 14/602,464

(22) Filed: Jan. 22, 2015

(65) Prior Publication Data

US 2015/0242143 A1 Aug. 27, 2015

(30) Foreign Application Priority Data

Feb. 21, 2014 (KR) ........................ 10-2014-0020813

(51) Int. Cl.

| | |
|---|---|
| ***G06F 11/00*** | (2006.01) |
| ***G06F 3/06*** | (2006.01) |
| ***G06F 11/07*** | (2006.01) |
| ***G11C 7/04*** | (2006.01) |
| ***G11C 16/34*** | (2006.01) |
| ***G11C 29/42*** | (2006.01) |
| ***G11C 29/50*** | (2006.01) |
| ***G11C 29/52*** | (2006.01) |
| *G11C 29/04* | (2006.01) |

(52) U.S. Cl.

CPC ........... *G06F 3/0619* (2013.01); *G06F 3/0629* (2013.01); *G06F 3/0679* (2013.01); *G06F 11/076* (2013.01); *G11C 7/04* (2013.01); *G11C 16/349* (2013.01); *G11C 29/42* (2013.01); *G11C 29/50004* (2013.01); *G11C 29/52* (2013.01); *G11C 2029/0409* (2013.01)

(58) Field of Classification Search

CPC .... G06F 3/0619; G06F 3/0629; G06F 3/0679; G06F 11/076; G06F 11/1008; G06F 11/1048; G06F 1/3225; G06F 1/3275; G06F 11/1068; G11C 2029/0409; G11C 16/349; G11C 29/42; G11C 29/50004; G11C 29/52; G11C 7/04; Y02B 60/1225; Y02B 60/1228

See application file for complete search history.

(56) References Cited

U.S. PATENT DOCUMENTS

| | | | |
|---|---|---|---|
| 7,236,061 | B2 | 6/2007 | Lin |
| 7,395,176 | B2 | 7/2008 | Chung et al. |
| 7,865,761 | B1 | 1/2011 | Chilton |

(Continued)

FOREIGN PATENT DOCUMENTS

| | | |
|---|---|---|
| JP | 2000011670 | 1/2000 |
| JP | 2008251066 | 10/2008 |

(Continued)

*Primary Examiner* — Guerrier Merant

(74) *Attorney, Agent, or Firm* — Volentine & Whitt, PLLC

(57) ABSTRACT

A flash memory system includes; a controller that determines at least one parameter related to data reliability based on temperature information and generates a control signal based on the at least one parameter; and a memory device that comprises one or more memory cell arrays and provides the controller with read data corresponding to a read command received from the controller.

16 Claims, 13 Drawing Sheets

(56) References Cited

U.S. PATENT DOCUMENTS

| | | | | |
|---|---|---|---|---|
| 8,176,237 | B2 * | 5/2012 | Yano | G06F 12/0246 711/103 |
| 8,645,770 | B2 * | 2/2014 | Fai | G06F 11/1068 714/704 |
| 2003/0122077 | A1 | 7/2003 | Kaufman et al. | |
| 2003/0189856 | A1 | 10/2003 | Cho et al. | |
| 2008/0137460 | A1 | 6/2008 | Incarnati et al. | |
| 2009/0310408 | A1 * | 12/2009 | Lee | G11C 11/5628 365/185.03 |
| 2010/0008151 | A1 | 1/2010 | Hwang | |
| 2010/0157672 | A1 | 6/2010 | Barkley | |
| 2011/0055671 | A1 * | 3/2011 | Kim | G06F 11/1028 714/800 |
| 2011/0219203 | A1 | 9/2011 | Nurminen et al. | |
| 2011/0302353 | A1 | 12/2011 | Confalonieri et al. | |
| 2012/0275235 | A1 | 11/2012 | Parker | |
| 2012/0278539 | A1 * | 11/2012 | Hosogaya | G06F 13/16 711/103 |
| 2013/0031443 | A1 | 1/2013 | Oh et al. | |
| 2013/0058181 | A1 | 3/2013 | Chen et al. | |
| 2013/0111299 | A1 * | 5/2013 | Hashimoto | G06F 11/1068 714/758 |
| 2013/0185606 | A1 * | 7/2013 | Fai | G06F 11/1068 714/704 |
| 2014/0047301 | A1 * | 2/2014 | Kurata | G06F 11/1008 714/773 |

FOREIGN PATENT DOCUMENTS

| | | |
|---|---|---|
| JP | 2009026119 | 2/2009 |
| JP | 2011227756 | 11/2011 |
| JP | 2011243132 | 12/2011 |
| JP | 2012238364 | 12/2012 |

* cited by examiner

FIG. 2

| | | | 0°c~10°c | 10°c~20°c | 20°c~30°c | 30°c~40°c | 40°c~50°c | 50°c~60°c | 60°c~70°c | 70°c~80°c | 80°c~90°c | 90°c~100°c |
|---|---|---|---|---|---|---|---|---|---|---|---|---|
| SLC | | RD coefficient | 1RDc1 | 1RDc2 | 1RDc3 | 1RDc4 | 1RDc5 | 1RDc6 | 1RDc7 | 1RDc8 | 1RDc9 | 1RDc10 |
| | | ERR coefficient | 1ERRc1 | 1ERRc2 | 1ERRc3 | 1ERRc4 | 1ERRc5 | 1ERRc6 | 1ERRc7 | 1ERRc8 | 1ERRc9 | 1ERRc10 |
| | | ITR coefficient | 1ITRc1 | 1ITRc2 | 1ITRc3 | 1ITRc4 | 1ITRc5 | 1ITRc6 | 1ITRc7 | 1ITRc8 | 1ITRc9 | 1ITRc10 |
| MLC | LSB | RD coefficient | 2RDc1 | 2RDc2 | 2RDc3 | 2RDc4 | 2RDc5 | 2RDc6 | 2RDc7 | 2RDc8 | 2RDc9 | 2RDc10 |
| | | ERR coefficient | 2ERRc1 | 2ERRc2 | 2ERRc3 | 2ERRc4 | 2ERRc5 | 2ERRc6 | 2ERRc7 | 2ERRc8 | 2ERRc9 | 2ERRc10 |
| | | ITR coefficient | 2ITRc1 | 2ITRc2 | 2ITRc3 | 2ITRc4 | 2ITRc5 | 2ITRc6 | 2ITRc7 | 2ITRc8 | 2ITRc9 | 2ITRc10 |
| | MSB | RD coefficient | 3RDc1 | 3RDc2 | 3RDc3 | 3RDc4 | 3RDc5 | 3RDc6 | 3RDc7 | 3RDc8 | 3RDc9 | 3RDc10 |
| | | ERR coefficient | 3ERRc1 | 3ERRc2 | 3ERRc3 | 3ERRc4 | 3ERRc5 | 3ERRc6 | 3ERRc7 | 3ERRc8 | 3ERRc9 | 3ERRc10 |
| | | ITR coefficient | 3ITRc1 | 3ITRc2 | 3ITRc3 | 3ITRc4 | 3ITRc5 | 3ITRc6 | 3ITRc7 | 3ITRc8 | 3ITRc9 | 3ITRc10 |
| | CSB | RD coefficient | 4RDc1 | 4RDc2 | 4RDc3 | 4RDc4 | 4RDc5 | 4RDc6 | 4RDc7 | 4RDc8 | 4RDc9 | 4RDc10 |
| | | ERR coefficient | 4ERRc1 | 4ERRc2 | 4ERRc3 | 4ERRc4 | 4ERRc5 | 4ERRc6 | 4ERRc7 | 4ERRc8 | 4ERRc9 | 4ERRc10 |
| | | ITR coefficient | 4ITRc1 | 4ITRc2 | 4ITRc3 | 4ITRc4 | 4ITRc5 | 4ITRc6 | 4ITRc7 | 4ITRc8 | 4ITRc9 | 4ITRc10 |

FLASH MEMORY SYSTEM AND METHOD CONTROLLING SAME

CROSS-REFERENCE TO RELATED APPLICATIONS

This application claims the benefit of Korean Patent Application No. 10-2014-0020813, filed on Feb. 21, 2014, the subject matter of which is hereby incorporated by reference.

BACKGROUND

The inventive concept relates to flash memory systems, and more particularly, to flash memory systems including a memory controller capable of controlling access to data stored in a flash memory array in response to temperature information.

Depending on the demand for high integration, flash memory systems have been scaled down and the number of bits stored in each memory cell has been increased. In addition, the amount of data that processed by a flash memory device and a flash memory system has been increased. Accordingly, reliability in the operation of the flash memory device or flash memory system has become increasing important.

Semiconductor memory devices may be classified as volatile (e.g., DRAM and SRAM) and nonvolatile (e.g., EEPROM, FRAM, PRAM, MRAM, and flash memory). A volatile memory device loses stored data in the absence of applied power, while a nonvolatile memory devices maintains stored data in the absence of applied power. In particular, flash memory devices have shown particular merit, such as high programming speeds, low power consumption, and high data storage capacity. As such, flash memory devices are widely used as a storage medium in various computing systems.

In contemporary flash memory devices, data states for each memory cell may be determined according to a number stored bits. Thus, a memory cell storing 1-bit data is referred to as a single-bit cell or a single-level cell (SLC), and a memory cell storing multi-bit data (e.g., two or more bits) is referred to as a multi-bit cell, a multi-level cell (MLC), or a multi-state cell.

SUMMARY

Embodiments of the inventive concept provide flash memory systems with improved reliability of stored data and read data. Embodiments of the inventive concept provide methods of controlling the operation of flash memory systems.

According to an aspect of the inventive concept, there is provided a flash memory system including: a controller that determines a data reliability parameter based on temperature information and generates a control signal in response to the data reliability parameter; and a memory device including a flash memory cell array that provides the controller with read data corresponding to a read command received from the controller, wherein the memory device performs an operation in response to the control signal generated in response to the data reliability parameter.

According to an aspect of the inventive concept, there is provided a method controlling a flash memory system, the flash memory system comprising a controller and a flash memory device. The method includes determining a data reliability parameter in response to temperature information, generating a control signal based on the data reliability parameter, generating a read command corresponding to the control signal, and reading read data stored in the flash memory device in response to the read command.

According to an aspect of the inventive concept, there is provided a method controlling a flash memory system, the flash memory system comprising a controller configured to perform an error correction operation including a number of error correction iterations on read data retrieved from a flash memory device. The method includes; determining a data reliability parameter in response to temperature information, generating a control signal based on the data reliability parameter, generating a read command corresponding to the control signal, reading the read data from the flash memory device in response to the read command, counting a number of error correction iterations, and comparing the counted number of error correction iterations with an iteration count threshold value to determine whether the read data includes at least one uncorrected read error.

BRIEF DESCRIPTION OF THE DRAWINGS

Certain embodiments of the inventive concept will be more clearly understood from the following detailed description taken in conjunction with the accompanying drawings in which:

FIG. 2 is an exemplary table to which a controller may refer when determining count threshold values related to data reliability according to the temperature;

DETAILED DESCRIPTION OF EMBODIMENTS

Figure 1:
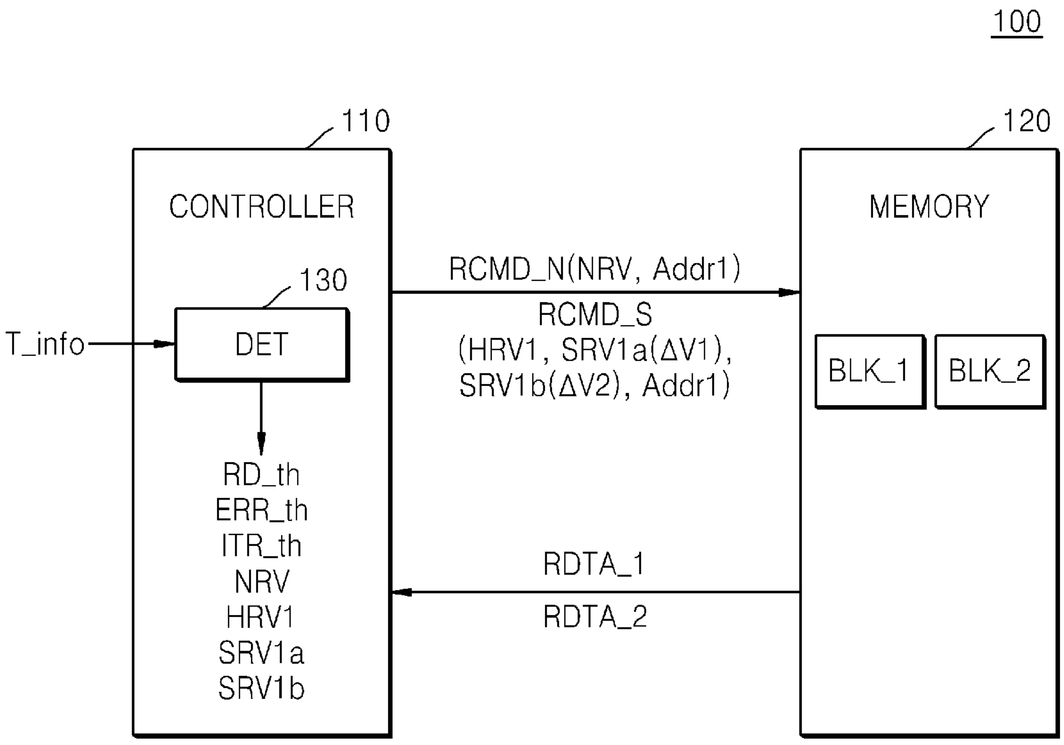
FIG. 1 is a block diagram of a flash memory system according to an embodiment of the inventive concept.

Hereinafter, the inventive concept will be described more fully with reference to the accompanying drawings in certain exemplary embodiments of the inventive concept are shown. The inventive concept may, however, be embodied in many different forms and should not be construed as being limited to only the illustrated embodiments. Rather, the illustrated embodiments are provided so that this disclosure will be thorough and complete, and will fully convey the inventive concept to those skilled in the art. Throughout the written description and drawings, like reference numbers and labels are used to denote like elements.

The terms used in this written description are used to describe particular embodiments and are not intended to limit the inventive concept. An expression used in the singular encompasses the expression of the plural, unless it has a clearly different meaning in the context. It will be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure (FIG. 1 is a block diagram of a flash memory system 100 according to an embodiment of the inventive concept.

Referring to FIG. 1, the flash memory system 100 generally comprises a controller 110 and a memory device 120. The controller 110 includes a determination unit 130.

The controller 110 may be used to write data to and/or read data from the memory device 120, and may further be used to manage operation of the memory device 120, such that data is reliably stored in and retrieved from the memory device 120.

The memory device 120 includes at least one memory cell array including nonvolatile memory cells operated as SLCs and/or MLCs. The memory device 120 may have a single-layer array structure (i.e., a two-dimensional array structure), or a multi-layer array structure (i.e., a three-dimensional array structure).

In one particular embodiment, operation of the flash memory system 100 will be described in relation to execution of a read operation. Here, the controller 110 is assumed to apply a normal read command (RCMD_N) to the memory device 120 in response to a read request received from a host (not shown). The normal read command includes information identifying a voltage level for a normal read voltage (NRV) as well as a first address (Addrl) for the nonvolatile memory cells to be read (i.e., the "target memory cells"). The level of the normal read voltage may be adjusted by the flash memory system 100 in response to temperature information (T_info). Thus, when a page designated by the first address is included in, for example, a first block, a read count corresponding to the first block will be incremented. The controller 110 may be used to compare the read count for the first block with a read count threshold value, and generate a refresh command for the first block when the read count reaches the read count threshold value.

The normal read command and the normal read voltage may be set to establish a case wherein no read error(s) arise from the target memory cells of the memory device 120, or a case wherein a number of read errors arising from the reading of the target memory cells exceeds the error correction capabilities of a constituent error correction code (ECC) operation performed by the flash memory system 100. This approach may be contrasted with the execution of a received soft decision read command (RCMD_S) and corresponding control voltages (HRV1, SRV1*a*, and SRV1*b*).

In response to the normal read command (RCMD_N), the memory device 120 retrieves the identified data from the target memory cells and provides first read data (RDTA_1). That is, the memory device 120 outputs data stored in nonvolatile memory cells to which the normal read voltage (NRV) is applied via a corresponding word line as indicated by the first address (Addrl) in order to provide the first read data. Here, the level of the normal read voltage associated with the normal read command may be provided via a normal read control signal.

The controller 110 may further be used to determine (e.g., using an ECC) whether or not corrected and/or uncorrected read error(s) exists in the first read data. Assuming that the controller 110 uses an iterative code, error detection and/or correction may be performed over a number of computational iterations. In such cases, an ECC iteration count may be incremented with each passing iteration, and when the ECC iteration count reaches an ECC iteration count threshold value, it may be determined that the first read data corresponding to the first address includes at least one uncorrected read error. This type of iterative ECC approach will be described in some additional detail with reference FIGS. 11A and 11B.

When an uncorrected error exists in the first read data (RDTA_1), the controller 110 may be used to communicate the soft decision command to the memory device 120, and the error count is incremented. And when the error count reaches an error count threshold value, the controller 110 may be used to communicate a reclaim command signal.

In response to the soft decision command, the memory device 120 may sequentially apply a first hard read voltage HRV1, a first soft read voltage SRV1$a$, and a second soft read voltage SRV1$b$ to a word line corresponding to the first address (Addr1) in order to obtain second read data (RDTA_2). Here, the respective level(s) of the first soft read voltage SRV1$a$ and second soft read voltage SRV1$b$ may be adjusted in response to the temperature information (T_info).

The first soft read voltage SRV1$a$ and second soft read voltage STV1$b$ form a pair of control voltages associated with the first hard read voltage HRV1. The first soft read voltage SRV1$a$ is separated from the first hard read voltage HRV1 by a first voltage difference ΔV1, and the second soft read voltage SRV1$b$ is separated from the first hard read voltage HRV2 by a second voltage difference ΔV2. For example, the level of the first soft read voltage SRV1$a$ may be lower than the level of the first hard read voltage HRV1 by the first voltage difference ΔV1, while the level of the second soft read voltage SRV1$b$ may higher than the level of the first hard read voltage HRV 1 by the second voltage difference ΔV2.

Similarly to the approach described above, the controller 110 may be used to determine, using a counted, iterative ECC approach, whether or not one or more read error(s) exists in the second read data (RDTA_2). And again, when it is determined that an uncorrected error exists in the second read data, the controller 110 may increase an read error count. When the error count reaches an error count threshold value, the controller 110 may generate a reclaim command signal.

As described above, the controller 110 includes the determination unit 130. The determination unit 130 may be used to determine (or adjust) at least one parameter (e.g., count threshold values (RD_th, ERR_th, and ITR_th), and read voltage levels (NRV, HRV1, SRV1$a$, and SRV1$b$)) associated with data reliability based on temperature information (hereafter, collectively or singularly referred to as a "data reliability parameter"). Such a data reliability parameter may be used in the context of certain embodiments of the inventive concept to control execution of read operations that secure read data having greater reliability over conventional approaches.

In one example, the data reliability parameter may be a read count threshold value RD_th for a first block of the memory device 120, wherein when a detected or calculated temperature associated with the flash memory system 100 increases (or decreases), the read count threshold value RD_th of the read count may be incremented (or decremented).

In another example, a given read count may indicate a number of times that a normal read command RCMD_N is generated by the controller 110 with respect to a first block BLK_1 of the memory device 120 (e.g., a number of times the normal read command RCMD_N that is generated by the controller 110 with respect to one page of a plurality of pages of the first block BLK_1).

Alternately, the read count may be a number of times that a soft decision command RCMD_S is generated by the controller 110 with respect to one page of a plurality of pages of the first block BLK_1.

When the read count for the first block BLK_1 reaches a read count threshold value RD_th, the controller 110 may move data stored in the first block BLK_1 to a second block BLK_2 and store the moved data in the second block BLK_2. For example, when the read count for the first block BLK_1 reaches the read count threshold value RD_th, the controller 110 may generate a refresh command signal with respect to the first block BLK_1.

In yet another example, the data reliability parameter may be an error count threshold value ERR_th for the first block of the memory device 120. Thus, when the temperature increases (or decreases), the error count threshold value ERR_th may increase (or decrease).

Thus, the error count may be a number of error bits received in response to the normal read command RCMD_N generated by the controller 110 with respect to the first block BLK_1 of the memory device 120. And/or the error count may be a number of error bits received in response to the soft decision command RCMD_S generated by the controller 110.

When the error count for the first block BLK_1 reaches or exceeds the error count threshold value ERR_th, the controller 110 may move data stored in the first block BLK_1 to the second block BLK_2 and store the moved data in the second block BLK_2 (i.e., the controller 110 may generate a reclaim command signal with respect to the first block BLK_1).

In still another example, the data reliability parameter may be an iteration count threshold value ITR_th for a first page of the memory device 120. Thus, when the temperature increases (or decreases), the iteration count threshold value ITR_th of the iteration count may increase (or decrease).

In one example, the iteration count may be a number of iterations that an iterative code is executed in response to the normal read command RCMD_N or the soft decision command RCMD_S generated by the controller 110 with respect to one page of a plurality of pages of the first block BLK_1. This particular type of iteration counting will be described in some additional detail hereafter.

Thus, to summarize just the particular examples of data reliability parameter(s) described above, a competent data reliability parameter may include one or more of read voltage levels (e.g., NRV, HRV1, SRV1$a$, and SRV1$b$) as adjusted in view of relevant temperature fluctuations. And since the controller 110 determines at least one data reliability parameter based on the temperature information, the reliability of data may be secured across a range of operating temperatures. Here, the temperature information may be externally provided to the controller 110 or internally generated by the controller 110.

The exemplary look-up table of FIG. 2 shows one possible set of data reliability parameters as a function temperature. Here, when the controller 110 determines at least one data reliability parameter based on temperature information, the at least one data reliability parameter may be used to generate a corresponding coefficient.

With reference to FIG. 2, when the memory device 120 is assumed to include a 2-bit MLCs, the controller 110 may determine data reliability parameters so that the data reliability parameters have different values according to the page be read (e.g., a Least Significant Bit (LSB), a Most Significant Bit (MSB) or a Central Significant Bit (CSB)).

In the exemplary table of FIG. 2, various data reliability parameters (e.g., count threshold values, such as the read count threshold value RD_th, the error count threshold value ERR_th, and the iteration count threshold value ITR_th) are shown as a function of temperature.

Referring to FIG. 2, a case where a memory cell array of the memory device 120 includes SLCs and a case where the memory cell array of the memory device 120 includes MLCs may be separated from each other to determine the parameters. When the memory cell array includes MLCs, the parameters may be determined according to whether the MLCs belong to an LSB page or an MSB page. When the memory cell array includes 3-bit MLCs, the parameters may be determined according to whether the 3-bit MLCs belong to a CSB page. That is, when the memory cell array includes MLCs, the parameters may have different values according to whether each parameter corresponds to which page of n pages connected to the same word line, where n is a natural number that is equal to or greater than two. In addition, the temperature may be divided into 10 temperature ranges to determine the parameters. Such a division is only an exemplary case, and the inventive concept is not limited thereto.

Accordingly, the determination unit 130 of FIG. 1 may be used to receive (or internally generate) temperature information, identify corresponding data reliability parameters, and select coefficients suitable for each circumstance.

Figure 3:
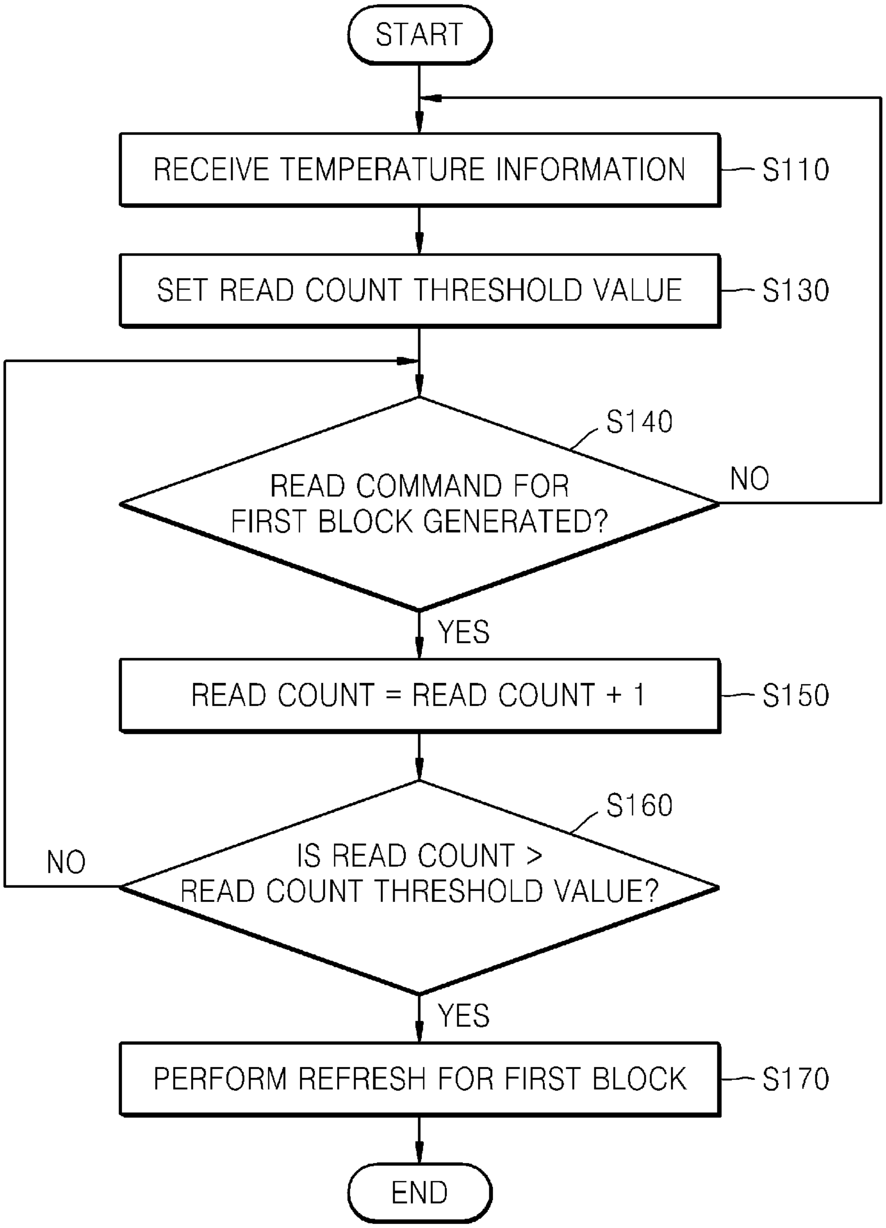
FIG. 3 is a flowchart of a process in which the controller determines a read count threshold value according to the temperature and generates a refresh command, according to an embodiment of the inventive concept.

FIG. 3 is a flowchart summarizing in one example a method of controlling the operation of the flash memory system 100 of FIG. 1. Here, the controller 110 may be used to determine a read count threshold value (RD_th) according to a current operating temperature and generate a refresh command.

Referring to FIGS. 1 and 3, the controller 110 receives temperature information _info (S110). The determination unit 130 then sets the read count threshold value RD_th through a polynomial predetermined according to the temperature information or with reference to a loop-up table (S130).

If a read command directed to the first block is generated (S140=YES), the read count is incremented (S150). Once the read count reaches the read count threshold value RD_th (S160=YES), the controller 110 performs a refresh on the first block (S170).

Figure 4:
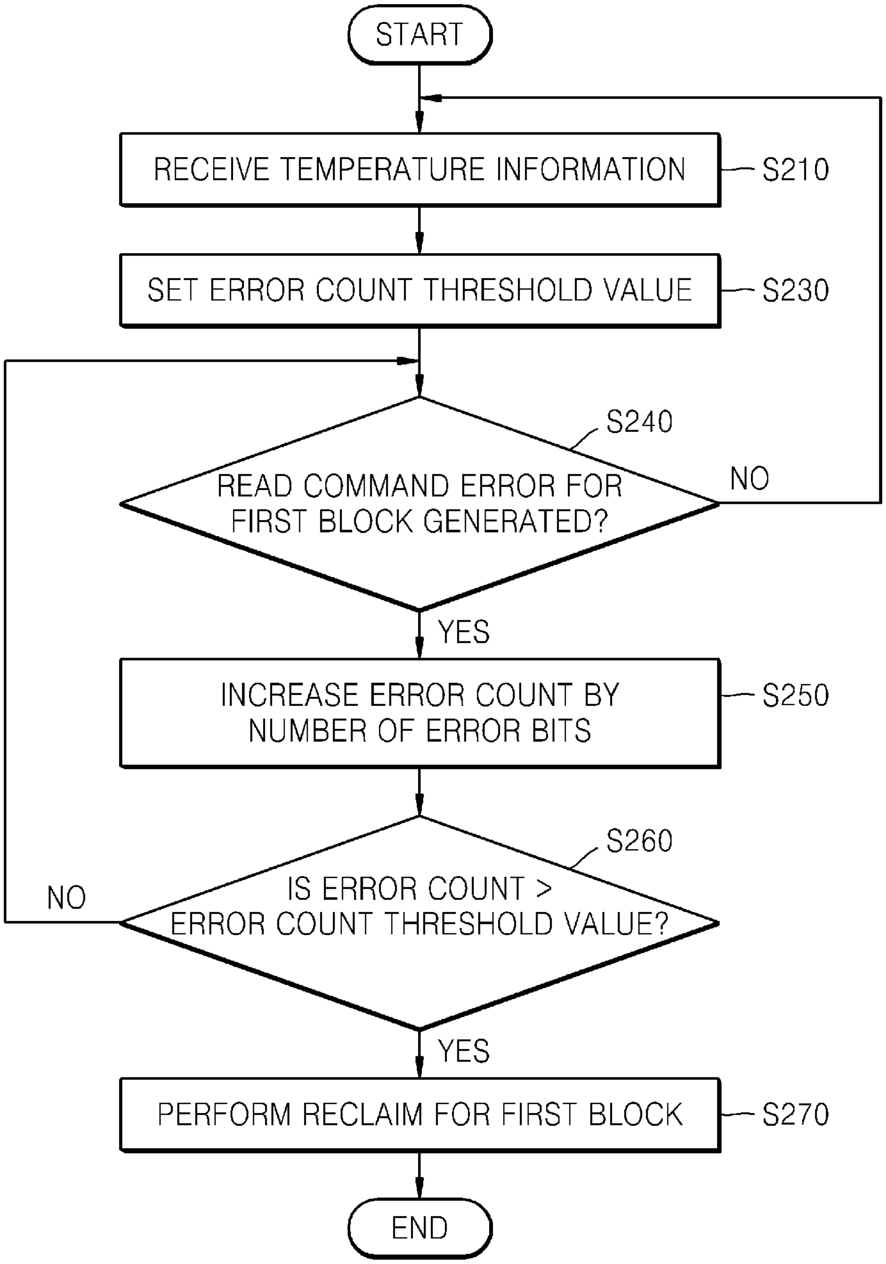
FIG. 4 is a flowchart of a process in which the controller determines an error count threshold value according to the temperature and generates a refresh command, according to an embodiment of the inventive concept.

FIG. 4 is a flowchart summarizing in another example a method of controlling the operation of the flash memory system 100 of FIG. 1. Here, the controller 110 may be used to determine an error count threshold value (ERR_th) in response to temperature information in order to generate a refresh command.

Referring to FIGS. 1 and 4, the controller 110 receives temperature information T_info (S210). The determination unit 130 sets the error count threshold value ERR_th through a polynomial predetermined according to the temperature information or with reference to a loop-up table (S230).

If a read command error for a first block is generated (5240=YES), an error count is increased by the number of error bits (S250). If the increased error count reaches or exceeds the error count threshold value ERR_th (S260=YES), the controller 110 performs a reclaim on the first block (S270).

Figure 5:
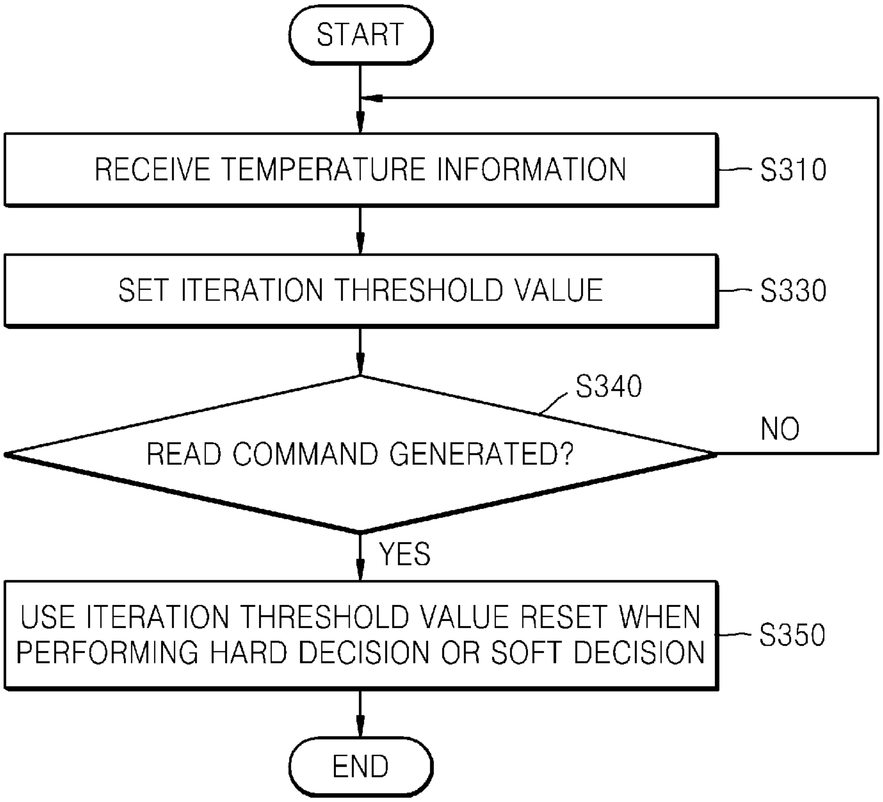
FIG. 5 is a flowchart of a process in which the controller determines an iteration count threshold value according to the temperature and uses an iteration count threshold value that is reset when performing a hard decision or a soft decision, according to an embodiment of the inventive concept.

FIG. 5 is a flowchart summarizing in another example a method of controlling the operation of the flash memory system 100 of FIG. 1. Here, the controller 110 determines the iteration count threshold value (ITR_th) in response to temperature information and uses an iteration count threshold value to reset a decision as to whether a hard decision or a soft decision should be performed.

Referring to FIGS. 1 and 5, the controller 110 receives temperature information (S310). The controller 110 then sets the iteration count threshold value ITR_th through a polynomial predetermined according to the temperature information or with reference to a loop-up table (S330).

When a read command directed to the first block is received (S340), an iteration threshold value that is reset when performing a hard decision or a soft decision is used (S350). In this case, the iteration count threshold value ITR_th may be set separately with respect to the hard decision and the soft decision.

Figure 6:
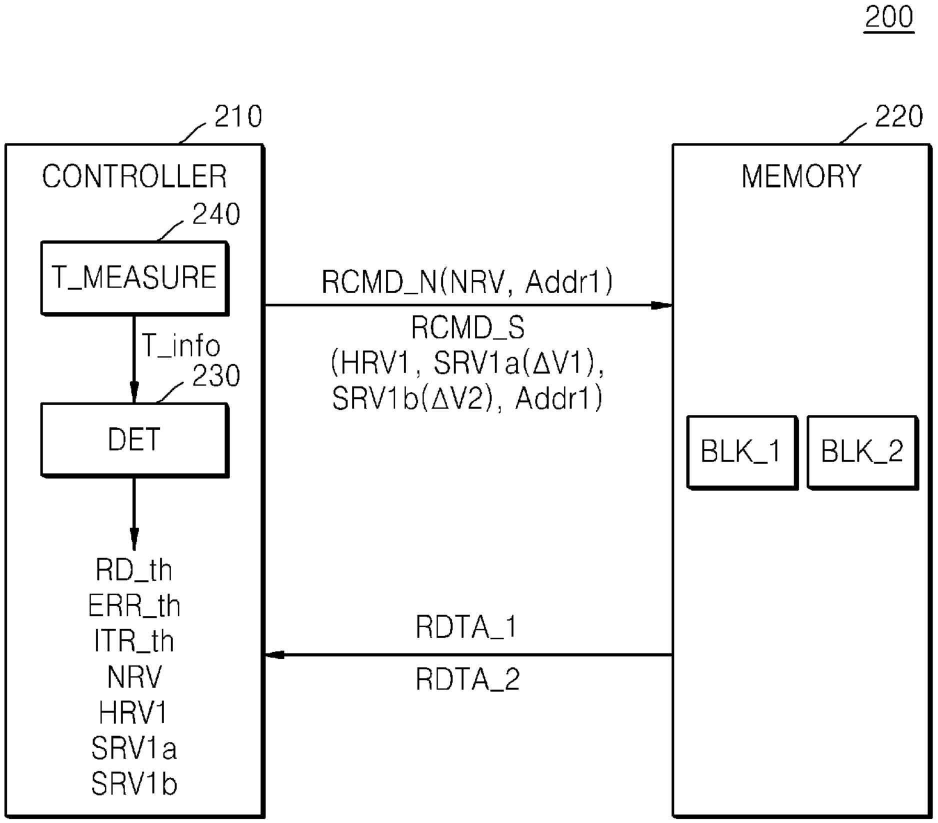
FIG. 6 is a block diagram of a flash memory system according to another embodiment of the inventive concept.

FIG. 6 is a block diagram of a flash memory system 200 according to another embodiment of the inventive concept. The flash memory system 200 of FIG. 6 is substantially similar in composition and operation with respect to the flash memory system 100 previously described in relation to FIG. 1. However, whereas the flash memory system 100 was assumed to receive from an external source the temperature information (T_info), the flash memory system 200 is assumed to internally generate temperature information (T_info) in a controller 210 using a temperature measurement unit 240.

As before, the determination unit 230 may be used to determine one or more data reliability parameters (e.g., count threshold values (RD_th, ERR_th, and ITR_th), or read voltages (NRV, HRV1, SRV1*a*, and SRV1*b*)) corresponding to temperature information T_info provided by the temperature measurement unit 240.

Since the controller 210 includes an internally disposed temperature measurement unit 240, the controller 210 may secure the reliability of data without the need of receiving externally provided temperature information.

Figure 7:
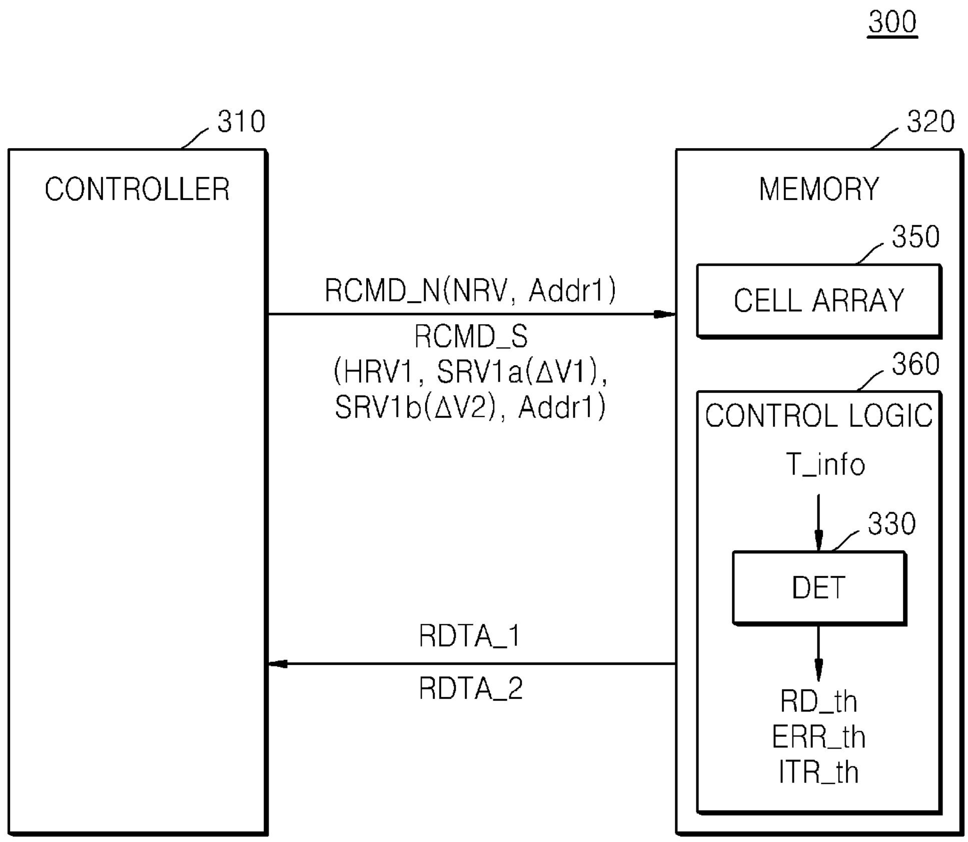
FIG. 7 is a block diagram of a flash memory system according to another embodiment of the inventive concept.

FIG. 7 is a block diagram of a flash memory system 300 according to another embodiment of the inventive concept.

Referring to FIG. 7, the flash memory system 300 includes a controller 310 and a memory device 320. The memory device 320 may include a cell array 350 and a control logic 360. In addition, the control logic 360 may include a determination unit 330.

The control logic 360 of the memory device 320 may generate parameters (for example, count threshold values (RD_th, ERR_th, and ITR_th)) according to temperature information T_info. The generated parameters may be used by the control logic 360 or may be transmitted to the controller 310 so as to be used by the controller 310.

Figure 8:
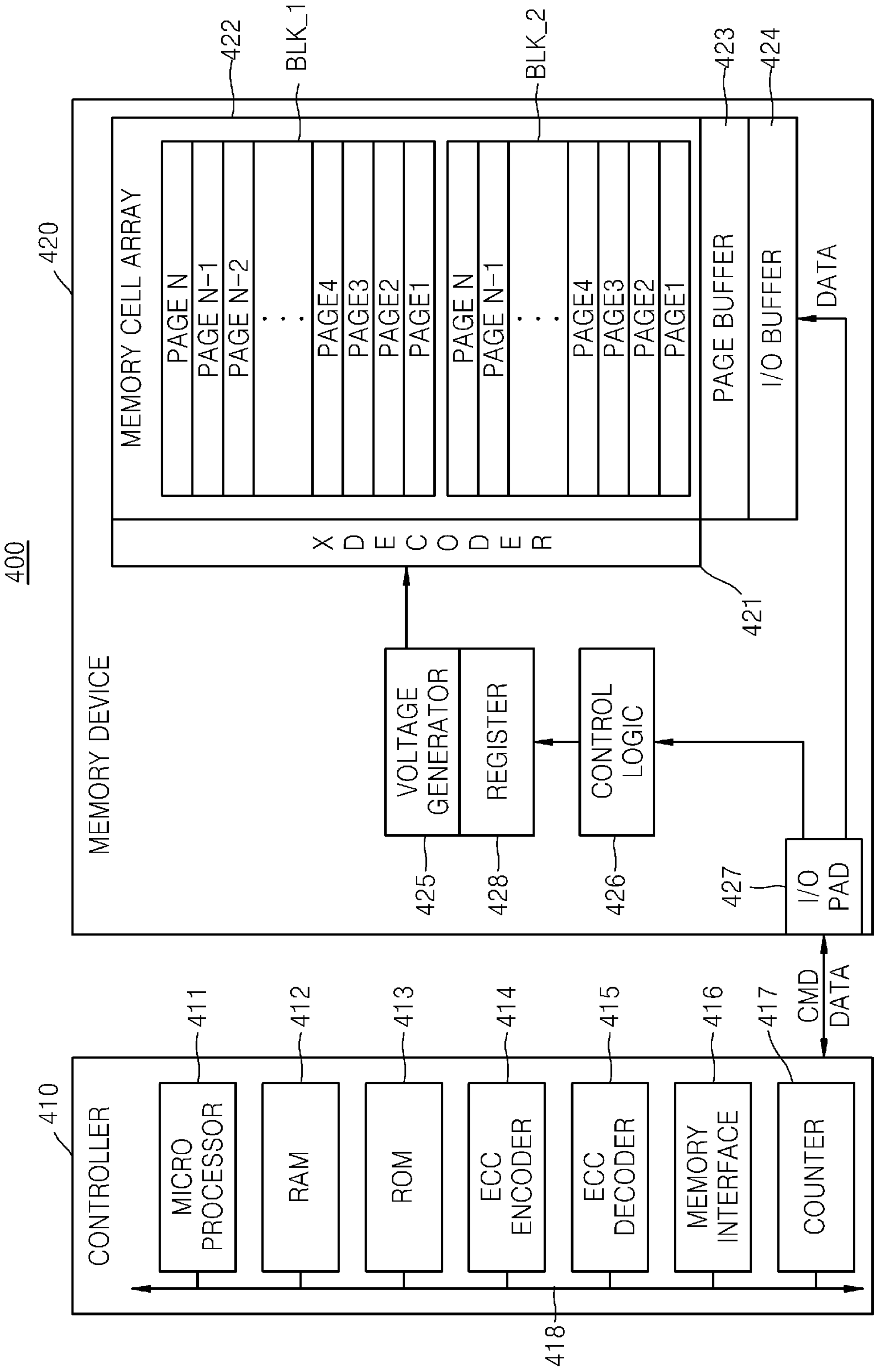
FIG. 8 is a block diagram of a memory system according to an embodiment of the inventive concept.

FIG. 8 is a block diagram of a memory system 400 according to still another embodiment of the inventive concept.

Referring to FIG. 8, the memory system 400 includes a controller 410 and a nonvolatile memory device 420, where the nonvolatile memory device 420 is assumed to be at least one NAND flash memory device.

The nonvolatile memory device 420 may include a cell array 422, an X-decoder 421 (i.e., a row selection circuit), a voltage generating circuit 425, an input/output (I/O) pad 427, an I/O buffer 424, a page buffer 423, and a control logic 436.

The cell array 422 may include a plurality of word lines W/L and a plurality of bit lines B/L, and each memory cell may store 1-bit data or M-bit data (i.e., multi-bit data), where M is a natural number that is equal to or greater than 2. Each memory cell may be a memory cell having a charge storage layer, such as a floating gate or a charge trap layer, or a memory cell having a variable resistance device.

The cell array 422 may include a plurality of blocks and a plurality of pages. Each block includes a plurality of pages. A page may be the unit of program and read operations, and a block may be the unit of an erase operation. The read operation is an operation of reading data programmed in one page.

The cell array 422 may have a single-layer array structure or a multi-layer array structure.

The control logic 426 controls the overall operation of the nonvolatile memory device 420. When a command CMD is received from the controller 410, the control logic 426 interprets the command CMD and controls the nonvolatile memory device 420 so that the nonvolatile memory device 420 performs operation(s) responsive to the interpreted command (e.g., a program operation, a read operation, a read retry operation, an erase operation, etc.). Here, the control logic 426 may also be used to store information identifying degraded pages as well as a count of degraded pages.

The X-decoder 421 is controlled in its operation by the control logic 426 and drives at least one of the plurality of word lines W/L of the cell array 422 according to a row address.

The voltage generating circuit 425 generates at least one voltage required during execution of a program operation, a first read operation, a second read operation, or an erase operation under the control of the control logic 426. As will be understood, the at least one voltage may be supplied to at least one word line W/L selected by the X-decoder 421.

A register 428 may be used to store information received from the controller 410 and may include a plurality of latches. For example, the register 428 may store information formed as a table by grouping read voltage information.

The page buffer 423 is controlled by the control logic 426 and operates as a sense amplifier or a write driver according to an operation mode, e.g., a read operation mode or a program operation mode.

The I/O pad 427 and the I/O buffer 424 may function as an I/O path of data that is transferred between an external device, e.g., the controller 410 or a host, and the nonvolatile memory device 420.

The controller 410 may include a microprocessor 411, read only memory (ROM) 413, random access memory (RAM) 412, an ECC decoder 415, an ECC encoder 414, a memory interface 416, a counter 417, and a bus 418. The microprocessor 411, the ROM 413, the RAM 412, the ECC decoder 415, the ECC encoder 414, the memory interface 416, and the counter 417 may be electrically connected to one another via the bus 418.

The microprocessor 411 controls an overall operation of the memory system 400 as well as an operation of the controller 410. When power is applied to the memory system 400, the microprocessor 411 may control an overall operation of the memory system 400 by driving, in the RAM 412, firmware for an operation of the memory system 400, which is stored in the ROM 413.

The microprocessor 411 may include the determination unit 130 of FIG. 1. Accordingly, the microprocessor 411 may determine the parameters (for example, the count threshold values (RD_th, ERR_th, and ITR_th)) according to the temperature information T_info.

In FIG. 8, firmware code driving the memory system 400 may be stored, wholly or in part, in the ROM 413. Other than the ROM 41,the firmware codes may be stored in the nonvolatile memory device 420. Accordingly, the control or interruption of the microprocessor 411 may include the interruption of the firmware, which is software which is driven by the microprocessor 411, as well as a direct control of the microprocessor 411.

The RAM 412 functions as a buffer and may store an initial command, data, and various variables, which are input from a host, and data that is output from the nonvolatile memory device 420. Also, the RAM 412 may store data that is input to or output from the nonvolatile memory device 420, and various parameters and variables.

The memory interface 416 may perform an interface between the controller 410 and the nonvolatile memory device 420. The memory interface 416 may be connected to the I/O pad 427 of the nonvolatile memory device 420 and may transmit data or receive data to or from the I/O pad 427. Also, the memory interface 416 may form a command that is suitable for the nonvolatile memory device 420 and may provide the I/O pad 427 with the command. The memory interface 416 provides the I/O pad 427 with a command, which is to be performed by the nonvolatile memory device 420, and an address for the nonvolatile memory device 420.

The ECC decoder 415 and the ECC encoder 414 perform an error bit correction. The ECC encoder 414 performs an error correction encoding on data that is provided to the nonvolatile memory device 420 and forms data with a parity bit added thereto. The parity bit may be stored in the nonvolatile memory device 420.

The ECC decoder 415 performs an error correction decoding on input data, determines whether the error correction decoding succeeded, according to the performance result, and outputs an instruction signal according to the determination result. Data read from the nonvolatile memory device 420 may be transmitted to the ECC decoder 415, and the ECC decoder 415 may correct an error bit of the data by using the parity bit. When the number of error bits is equal to or greater than an error bit threshold value, the ECC decoder 415 may not correct an error bit, and thus, an error correction fail occurs. The ECC encoder 414 and the ECC decoder 415 may perform an error correction by using a coded modulation, such as a low density parity check (LDPC) code, a Bose Chaudhuri Hocquenghem (BCH) code, a turbo code, a Reed-Solomon code, a convolution code, a recursive systematic code (RSC), a trellis-coded modulation (TCM), and a block coded modulation (BCM). However, the inventive concept is not limited thereto.

The ECC encoder 414 and the ECC decoder 415 may include a circuit, a system, or an apparatus which is used for error correction.

The counter 417 may be used to count read command(s), a number of error bits, or a number of ECC iterations, for example.

The memory interface 416 provides the read command and an address to the nonvolatile memory device 420. The nonvolatile memory device 420 reads data stored in a page of a first block BLK_1 corresponding to the address provided from the memory interface 416. The read data is provided to the ECC decoder 415 via the I/O pad 427. The ECC decoder 415 checks an error bit of data provided from the nonvolatile memory device 420 and corrects the error bit.

Figure 9A:
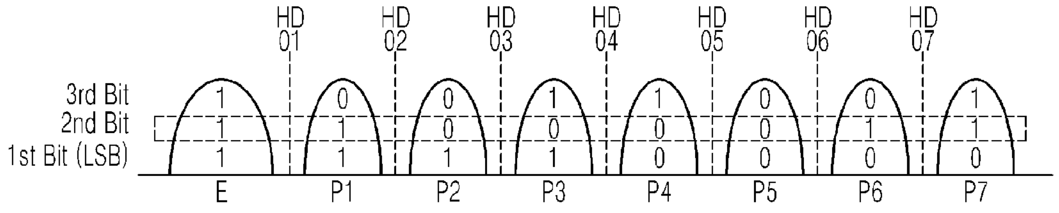
FIG. 9, inclusive of FIGS. 9A, 9B and 9C, is a diagram showing a threshold voltage distribution formed in each memory cell of a flash memory in a program operation.
Figure 9B:
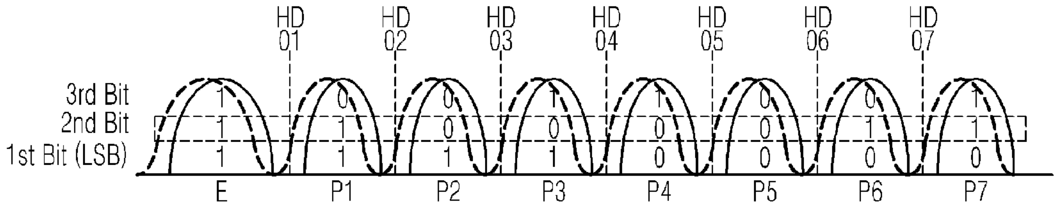
Figure 9C:
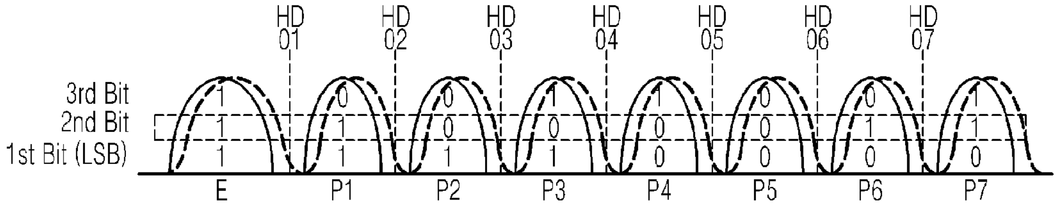

FIG. 9, inclusive of FIGS. 9A to 9C, illustrates a threshold voltage distribution formed for memory cells of a flash memory during a program operation.

Referring to FIG. 9A, a threshold voltage of a memory cell in which multi-bit data, e.g., 3-bit data, is programmed may correspond to any one of data states E and P1 to P7 of eight levels. Each of the data states E and P1 to P7 may form a threshold voltage window. One memory cell may store 3-bit data, and each bit may be independently programmed through several steps of the program operation. For example, in a 3-bit MLC, a program for a first bit (i.e., an LSB) of 3 bits may be performed first. Then, a program for a second bit and a program for a third bit may be sequentially performed.

In the actual implementation of a flash memory, a threshold voltage distribution of each data state may be changed from one indicated by a solid line to one indicated by a dashed line due to a change in temperature, as shown in FIGS. 9B and 9C. FIG. 9B shows a threshold voltage distribution (a curve indicated by a dashed line) spread out towards a low voltage side, compared to an initial threshold voltage distribution (a curve indicated by a solid line), and FIG. 9C shows a threshold voltage distribution (a curve indicated by a dashed line) spread out towards a high voltage side, compared to an initial threshold voltage distribution (a curve indicated by a solid line). Such a phenomenon may be severe when the amount of change in temperature increases. The possibility of errors occurring due to these causes may be lowered through a refresh or a reclaim.

Figure 10:
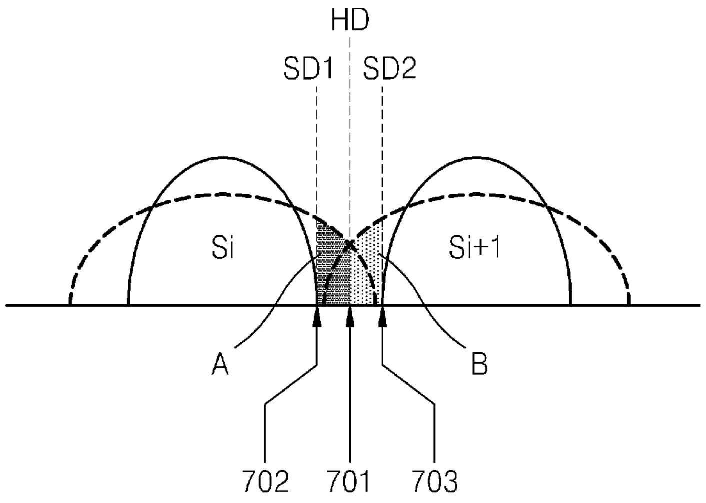
FIG. 10 is a diagram showing adjacent data states to explain flash memory control methods according to various embodiments of the inventive concept.

FIG. 10 is a diagram showing adjacent data states and further explaining a flash memory control method according to certain embodiments of the inventive concept.

Referring to FIG. 10, in data states programmed in a memory cell, a predetermined voltage interval has to be maintained between adjacent data states (Si and Si+1) so that a read margin may be sufficiently secured. A reference read voltage may be set based on ideal data states. Ideal data states Si and Si+1 indicated by a solid line may be distinguished by a reference read voltage indicated by the numeral 701. A read operation that is performed by using the reference read voltage 701 is referred to as a hard decision read operation. Thus, the reference read voltage 701 may be referred to as a hard decision read voltage.

However, each of the ideal data states Si and Si+1 may be changed to a non-ideal data state, as indicated by a dashed line, due to a change in temperature. If the ideal data states Si and Si+1 indicated by the solid line are changed to non-ideal data states as indicated by the dashed line, it is difficult to distinguish the changed data states, i.e., the non-ideal data states, by using only the hard decision read operation. In this case, the distinction of the changed data states, i.e., the non-ideal data states, may be performed through a soft decision read operation. Reliable data obtained by the soft decision read operation in addition to hard decision data may be provided to an error correction circuit and thus may be used for correcting errors which the changed data states, i.e., the non-ideal data states, may have. The soft decision read operation may be performed by using a first soft decision read voltage indicated by the numeral 702 at a low voltage side and a second soft decision read voltage indicated by the numeral 703 at a high voltage side.

Figure 11A:
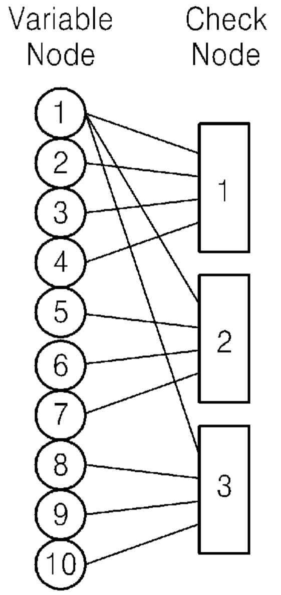
FIG. 11, inclusive of FIGS. 11A and 11B, is a diagram explaining a low density parity check (LDPC) decoding method that is used in flash memory reading methods according to various embodiments of the inventive concept.
Figure 11B:
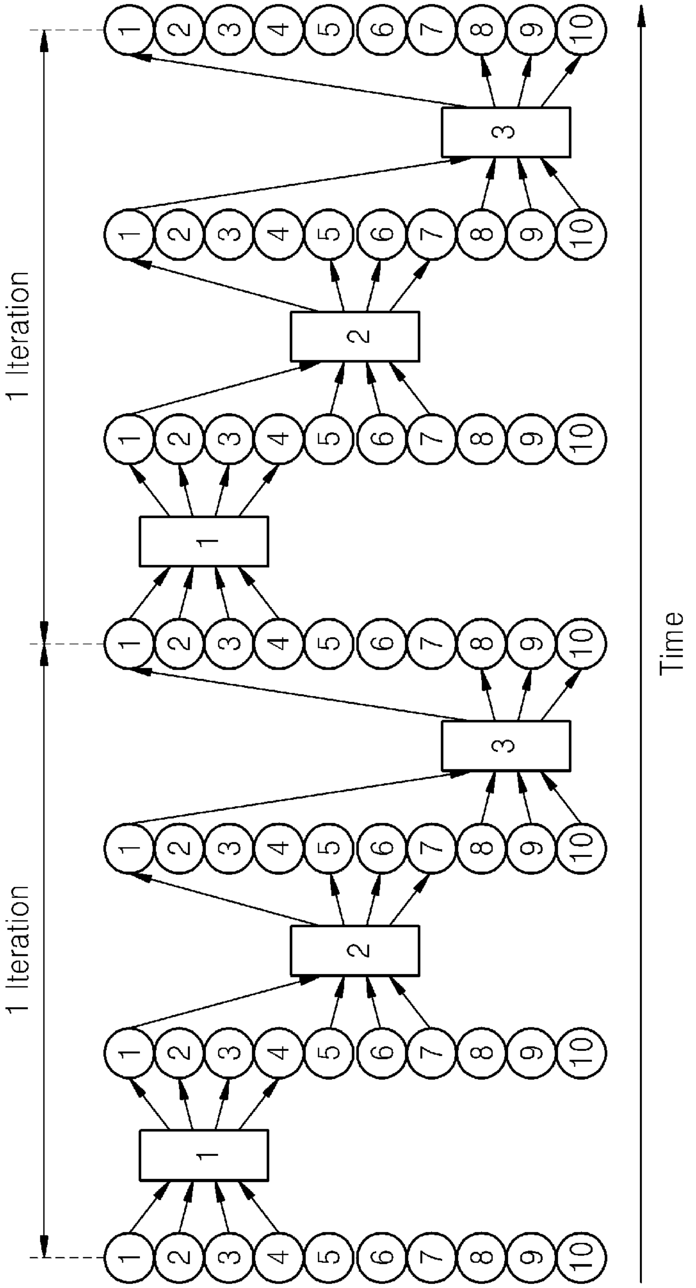

FIG. 11, inclusive of FIGS. 11A and 11B, further explains an LDPC decoding method that may be used in flash memory reading methods according to embodiments of the inventive concept.

Referring to FIG. 11A, an LDPC decoding may be performed by using a bipartite graph that is referred to as a Tanner graph. The Tanner graph may include variable nodes and check nodes. The variable nodes correspond to data bits, i.e., a codeword, read from a flash memory, and the check nodes correspond to parity-check constraints between the variable nodes to which the check nodes are connected. The LDPC decoding is performed by transmitting and receiving messages to and from the Tanner graph and using a sum product algorithm (SPA). One round of message exchanges between the variable nodes and the check nodes is referred to as "one iteration".

As illustrated in FIG. 11B, a plurality of iteration processes are required to obtain sufficient decoding characteristics. Through the plurality of iteration processes, received data bits may be estimated according to results of the calculation of a message from a variable node to a check node from among messages transmitted and received between the variable and check nodes and the calculation of a message from a check node to a variable node from among the messages.

However, during LDPC decoding, the time required for a message calculation in each iteration may influence overall decoding time. In particular, when it is difficult to correctly know which data state the threshold voltage distribution of a memory cell exists in when reading data, performing a message calculation according to a plurality of iterations may increase an LDPC decoding time. Accordingly, decoding efficiency may be reduced.

However, in flash memory reading methods according to embodiments of the inventive concept, an iteration count threshold value ITR_th of a soft decision decoding may be adjusted (up or down) when the threshold voltage of a memory cell is shifted due to temperature variation.

For example, when the operating temperature increases and thus the possibility of error correction is relatively low, the iteration count threshold value ITR_th of the soft decision decoding may be relatively less changed to implement a fast decoding. For example, when the temperature increases and thus the possibility of error correction is relatively low, the iteration count threshold value ITR_th of the soft decision decoding may be relatively greatly changed to implement a correct decoding. Also when the temperature decreases, the LDPC decoding may be similarly implemented. Through such a flash memory control method, decoding efficiency in an error correction operation may be improved.

Figure 12:
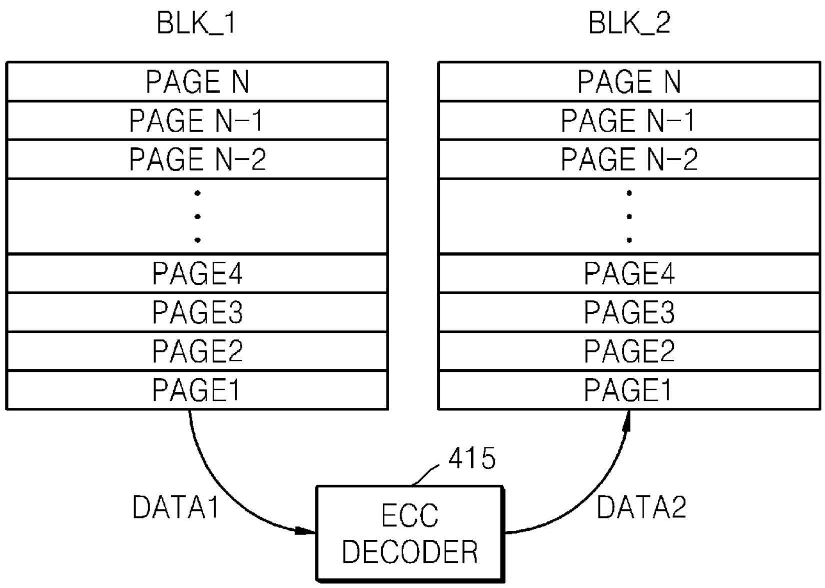
FIG. 12 is a conceptual diagram for explaining a reclaim or a refresh according to some embodiments of the inventive concept.

FIG. 12 is a conceptual diagram explaining a reclaim operation (or a refresh operation) according to certain embodiments of the inventive concept. FIG. 12 assumes a first block BLK_1, a second block BLK_2, and an ECC decoder 415 of a nonvolatile memory.

According to some embodiments of the inventive concept, it may be determined that a page, in which an error count is equal to or greater than an error count threshold value, among pages of the first block BLK_1 of the nonvolatile memory, is a degraded page. In addition, the pages of the first block BLK_1 may be reclaimed by the second block BLK_2 with reference to a result obtained by counting the number of degraded pages of the first block BLK_1.

When an error count in the first block BLK_1 of the nonvolatile memory is equal to or greater than the error count threshold value, the pages of the first block BLK_1 may be reclaimed by the second block BLK_2. Thus, it may be determined that a page, in which a read count is equal to or greater than a read count threshold value, among the pages of the first block BLK_1 of the nonvolatile memory, is a degraded page. In addition, the pages of the first block BLK_1 may be refreshed by the second block BLK_2 with reference to a result obtained by counting the number of degraded pages of the first block BLK_1.

When a read count in the first block BLK_1 of the nonvolatile memory is equal to or greater than the read count threshold value, the pages of the first block BLK_1 may be refreshed by the second block BLK_2.

When reclaiming or refreshing, first data DATA1 of the first block BLK_1 is read, and error bits of the read first data DATA1 are provided to the ECC decoder 415. The ECC decoder 415 provides second data DATA2 obtained by correcting the error bits of the first data DATA1. Reclaim is to program the second block BLK_2 by using the second data DATA2 obtained by correcting the error bits of the first data DATA1.

Specifically, the second data DATA2 obtained by correcting error bits of the first data DATA1 read from each page of the first block BLK_1 is programmed in each page of the second block BLK_2. The first block BLK_1 may be provided as a new free block.

Figure 13:
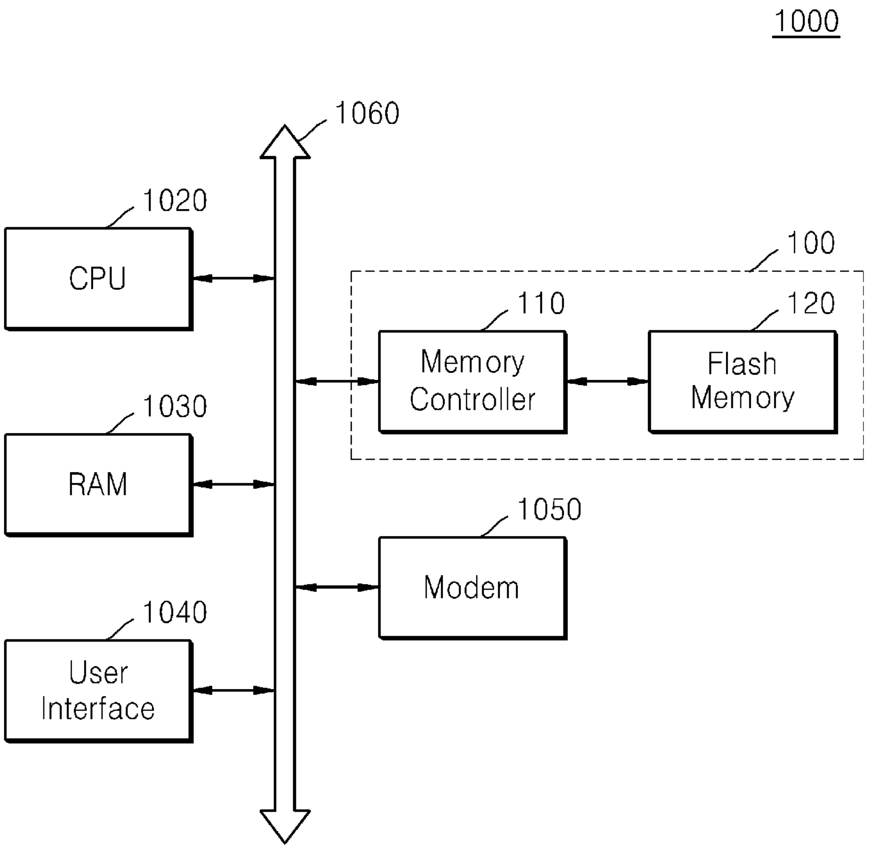
FIG. 13 is a block diagram of a computing system using a flash memory reading method according to an embodiment of the inventive concept.

FIG. 13 is a block diagram of a computing system 1000 using a flash memory reading method according to an embodiment of the inventive concept.

Referring to FIG. 13, the computing system 1000 may include a central processing unit (CPU) 1020, RAM 1030, a user interface 1040, a modem 1050 such as a baseband chipset, and a memory system 100, which are connected to a system bus 1060.

The memory system 100 may include a memory controller 110 and a flash memory device 120. The memory controller 110 may connect the CPU 1020 and the flash memory device 120 via the system bus 1060. The memory controller 110 may provide an interface with the flash memory device 120 to correspond to a bus format of the CPU 1020. The memory system 100 may constitute a solid state disk (SSD). In this case, the memory controller 110 may be configured to communicate with the outside (e.g., a host) via one of various interface protocols, such as USB, MMC, PCI-E, SAS, SATA, PATA, SCSI, ESDI, and IDE.

The memory controller 110 may be configured in the same manner as the memory controller 110 illustrated in FIG. 1. Also, the memory controller 110 may use the flash memory reading methods according to the above-described various embodiments of the inventive concept. The flash memory device 120 may be configured in the same manner as the memory devices illustrated in FIGS. 1, 6 and 7.

The memory controller 110 uses temperature information T_info to control the flash memory device 120. The memory controller 110 may determine at least one parameter (for example, the count threshold values (RD_th, ERR_th, and ITR_th), or the read voltages (NRV, HRV 1, SRV 1 a, and SRV lb)) related to data reliability based on the temperature information T_info.

When the computing system 1000 is a mobile device, a battery for supplying an operating voltage of the computing system 1000 is additionally provided. Also, the computing system 1000 may further include an application chipset, a camera image processor (CIS), mobile DRAM, and the like.

The memory controller 110 and/or the flash memory device 120 according to the current embodiment of the inventive concept may be embedded using various types of packages. For example, the memory controller 110 and/or the flash memory 120 may be embedded using packages, such as a package on package (POP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline integrated circuit (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

While the inventive concept has been particularly shown and described with reference to exemplary embodiments thereof, it will be understood that various changes in form and details may be made therein without departing from the spirit and scope of the following claims.

What is claimed is:

1. A flash memory system responsive to a read request received from a host, the flash memory system comprising:

a controller and a memory device including a flash memory cell array, wherein the controller is configured to receive the read request directed to a block of the flash memory cell array, increment a read count value For the block in response to the read request, and compare the incremented read count value to a read count threshold value and if the incremented read count is not less than the read count threshold value, apply a refresh command to the memory device, the memory device is configured to perform a refresh operation on the block in response to the refresh command, and the read count threshold value is determined by the controller in response to temperature information for the flash memory cell array, if the incremented read count is less than the read count value, the controller applies a normal read command indicating a read voltage to the memory device, and the memory device is further configured to perform a normal read operation on the block and provide read data to the controller in response to the normal read command, and the read voltage is determined by the controller in response to the temperature information for the flash memory cell array, wherein the controller is further configured to determine an error count for the read data, such that if the error count is not less than an error count threshold value, the controller applies a reclaim command to the memory device, the memory device is further configured to perform a reclaim operation on the block using another block of the flash memory cell array, and the error count threshold value is determined by the controller in response to the temperature information.

2. The flash memory system of claim 1, wherein the error count is an uncorrected error count for the read data and the controller is further configured to determine the uncorrected error count using an iteratively applied an error correction code (ECC) that generates an ECC iteration count, if the ECC iteration count is not less than an ECC iteration count threshold value for at least a page of the block, the controller applies a soft decision read command to the memory device, the memory device is further configured to perform a soft decision read operation in response to the soft read command using a soft decision read voltage, and at least one of the ECC iteration count threshold value and soft decision read voltage is determined by the controller in response to the temperature information.

3. The flash memory system of claim 2, wherein the temperature information is externally provided to the controller.

4. The flash memory system of claim 2, wherein the temperature information is internally generated by the controller.

5. The flash memory system of claim 3, wherein the controller is further configured to receive the temperature information, store the temperature information in a look-up table, and generate a data reliability parameter including at least one of the read voltage, read count threshold value, error count threshold value, ECC iteration count threshold value, and soft decision read voltage using the controller by referencing the look-up table.

6. The flash memory system of claim 4, wherein the controller internally generates the data reliability parameter using a predetermined polynomial based on the temperature information.

7. The flash memory system of claim 1, wherein the flash memory cell array comprises at least one of single-level cells (SLCs) and multi-level cells (MLCs).

8. The flash memory system of claim 5, wherein the flash memory cell array includes multi-level cells (MLCs), and the data reliability parameter is adjusted by the controller according to a page of the block indicated by the read request.

9. The flash memory system of claim 1, wherein the controller and memory device are fabricated in a single chip or respectively in separate chips connected to the host.

10. A method controlling a flash memory system connected to a host, the flash memory system comprising a controller and a flash memory device including a flash memory cell array, the method comprising:

receiving in the controller from the host a read request directed to a block of the flash memory cell array;

incrementing a read count value for the block in response to the read request and comparing the incremented read count value to a read count threshold value;

if the incremented read count is not less than the read count threshold value, providing a refresh command from the controller to the memory device;

performing a refresh operation on the block in response to the refresh command, wherein the read count threshold value is determined by the controller in response to temperature information for the memory cell array if the incremented read count is less than the read count threshold value, providing a normal read command from the controller indicating a read voltage level to the memory device; and performing a normal read operation on the block in response to the normal read command to provide read data to the controller, wherein the read voltage is determined by the controller in response to the temperature information for the memory cell array;

determining an error count for the read data in the controller;

determining whether the error count is less than an error count threshold value;

if the error count is not less than an error count threshold value, providing a reclaim command from the controller to the memory device; and performing a reclaim operation on the block using another block of the memory cell array in response to the reclaim command wherein the error count threshold value is determined by the controller in response to the temperature information.

11. The method of claim 10, wherein the flash memory cell array comprises a three-dimensional memory array.

12. A method of controlling the operation of a memory system including a memory device including a flash memory cell array and a controller that receives a read request from a host directed to a page of a block of the flash memory cell array and stores temperature information for the flash memory cell array, the method comprising:

in response to the read request, determining in the controller a hard read voltage for a normal read operation and soft read voltage for a soft decision read operation in response to the temperature information;

performing the normal read operation using the hard read voltage to obtain first data;

incrementing a read count for the block upon performing the normal read operation, and comparing the incremented read count with a read count threshold value;

upon determining that the incremented read count reaches the read count threshold value, performing a refresh operation on the block;

after performing the normal read operation, iteratively applying error correction to the first data to determine whether the first data includes an uncorrected error, wherein each iteration of error correction increments an error count for the first data;

comparing the incremented error count to an error count threshold value; and upon determining that the incremented error count reaches the error count threshold value, performing a reclaim operation on the block, wherein at least one of the hard read voltage, soft read voltage, read count threshold value and error count threshold value in determined in the controller in response to the temperature information.

13. The method of claim 12, wherein the refresh operation copies the first data from the block to another block of the flash memory cell array, and the reclaim operation corrects the first data by applying the error correction to the first data to generate corresponding second data, and programming the corresponding second data to the another block.

14. The method of claim 13, further comprising:

after performing the hard read operation and applying the error correction, performing a soft read operation using the soft decision read voltage on the block.

15. The method of claim 13, wherein the temperature information is externally provided from the host to the controller and stored in a look-up table in the controller.

16. The method of claim 13, wherein the temperature information is internally generated by the controller and stored in a look-up table in the controller.

* * * * *